(12) United States Patent
Jung

(10) Patent No.: US 7,399,685 B2
(45) Date of Patent: Jul. 15, 2008

(54) LASER BEAM PATTERN MASK AND CRYSTALLIZATION METHOD USING THE SAME

(75) Inventor: Yun Ho Jung, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 461 days.

(21) Appl. No.: 11/143,586

(22) Filed: Jun. 3, 2005

(65) Prior Publication Data

US 2005/0271952 A1    Dec. 8, 2005

(30) Foreign Application Priority Data

Jun. 4, 2004    (KR) ...................... 10-2004-0040862

(51) Int. Cl.
*H01L 21/36* (2006.01)
*H01L 21/20* (2006.01)

(52) U.S. Cl. ................. 438/478; 438/482; 438/486
(58) Field of Classification Search ............. 438/149, 438/478
See application file for complete search history.

(56) References Cited

U.S. PATENT DOCUMENTS

| | | | | |
|---|---|---|---|---|
| 6,337,233 | B2 * | 1/2002 | Yang | 438/158 |
| 6,736,895 | B2 * | 5/2004 | Jung | 117/37 |
| 2003/0022421 | A1 * | 1/2003 | Shimoto et al. | 438/149 |

OTHER PUBLICATIONS

Robert S. Sposilli, et al. "Single-Crystal Si Films via a Low-Subsgtrate-Temperature Excimer-Laser Crystallization Method," Materials Research Society Symp. Proc. vol. 452, pp. 953-958, 1997.

* cited by examiner

*Primary Examiner*—Mark A. Robinson
*Assistant Examiner*—Valerie Brown
(74) *Attorney, Agent, or Firm*—Morgan, Lewis & Bockius LLP

(57) ABSTRACT

A laser beam pattern mask includes an opaque substrate and a plurality of transmission portions formed in the substrate to transmit light, wherein each of the transmission portions extend in a first direction while being uniformly spaced apart from one another by a predetermined distance in a second direction perpendicular to the first direction, each of the transmission portions including hexagonal cells arranged in the first direction and in contact with one another.

9 Claims, 12 Drawing Sheets

Grain boundary in the form of a plurality of lines

Grain boundaries in the form of dots

LASER BEAM PATTERN MASK AND CRYSTALLIZATION METHOD USING THE SAME

This application claims the benefit of the Korean Patent Application No. P2004-040862, filed on Jun. 4, 2004 which is hereby incorporated by reference as if fully set forth herein.

BACKGROUND OF THE INVENTION

1. Field of the Invention

The present invention relates to crystallization of silicon, and more particularly, to a laser beam pattern mask and a crystallization method using the same to improve the crystallization characteristics.

2. Discussion of the Related Art

With society becoming more dependent on information, the demand for various display devices has steadily increased. To meet such demands, efforts have been made recently to research flat panel display devices such as liquid crystal displays (LCDs), plasma display panels (PDPs), electro-luminescent displays (ELDs), vacuum fluorescent displays (VFDs), and the like. Practical applications of these flat panel display devices include integration with various appliances for display purposes.

In particular, LCDs have been used as a substitute for cathode ray tubes (CRTs) in association with mobile image display devices. Compared to CRTs, LCDs have superior picture quality, light weight, thin size, and low power consumption. Thus, LCDs are currently most widely used. Various applications of LCDs are being developed in association with not only mobile image display devices such as monitors of notebook computers, but also as monitors of televisions to receive and display broadcast signals, and as monitors of desktop computers.

Such LCDs mainly include a liquid crystal panel for displaying an image and a driver for applying a drive signal to the liquid crystal panel. The liquid crystal panel includes first and second substrates joined together with space therebetween and a liquid crystal layer constituted by liquid crystals sealed in the space provided.

The first substrate (TFT array substrate) includes a plurality of uniformly spaced gate lines arranged in one direction and a plurality of uniformly spaced data lines arranged in a direction perpendicular to the gate lines. The first substrate also includes a plurality of pixel electrodes arranged in the form of a matrix array at respective pixel regions, each pixel region defined by an intersection of each gate line and each data line. The first substrate further includes a plurality of thin film transistors (TFTs), each of which is switched on by a signal on an associated one of the gate lines and transmits a signal on an associated one of the data lines to an associated one of the pixel electrodes.

The second substrate (color filter substrate) includes a black matrix layer for blocking incidence of light to a region other than the pixel regions. The second substrate also includes red (R), green (G), and blue (B) color filter layers for reproducing color tones and a common electrode for reproducing an image.

The first and second substrates are joined by a seal member having a liquid crystal injection port formed by spacers to maintain a certain amount of space between the first and second substrates. Liquid crystal material is sealed in the space between the first and second substrates.

The driving principle of the above-mentioned general LCDs utilizes optical anisotropy and polarization properties of the liquid crystals. Since liquid crystals have thin and elongated molecular structures, molecules thereof have an orientation in a certain direction. It is possible to control the orientation of liquid crystal molecules by intentionally applying an electric field to the liquid crystal molecules. By controlling the orientation of liquid crystal molecules, the arrangement of liquid crystal molecules is varied so as to exhibit optical anisotropy. Images are generated when light incident to the liquid crystals is refracted in the direction in which the liquid crystal molecules are oriented.

Currently, active matrix LCDs, in which thin film transistors and pixel electrodes connected to the thin film transistors (TFTs) are arranged in a matrix array, are of most interest because they offer superior resolution and superior moving picture reproduction capabilities. Because the semiconductor layer of each TFT in LCDs is made of polysilicon, it is possible to form TFTs and driving circuits on the same substrate. Doing so eliminate the need to use a separate process for connecting the TFTs and driving circuits. Therefore, the manufacturing process of such LCDs is simplified. In addition, polysilicon has rapid response because the field effect mobility of polysilicon is 100 to 200 times that of amorphous silicon. Polysilicon also exhibits superior stability to temperature and light.

Formation of polysilicon may be classified into a low-temperature process and a high-temperature process in terms of process temperature. The high-temperature process requires a temperature condition higher than the strain temperature of an insulating substrate on which polysilicon is to be grown. The process temperature of the high-temperature process is on the order of 1,000° C. For this reason, one disadvantage is that it is necessary to use expensive, high thermal resistance substrates such as quartz in place of cheap, low heat resistance substrates such as glass as the insulating substrate.

Furthermore, a high surface roughness is required to form a polysilicon thin film using the high-temperature process. However, the same high-temperature process degrades the crystallinity of fine crystalline grains. For this reason, another disadvantage of polysilicon formed in accordance with the high-temperature process is a degradation in the very characteristics required for the application thereof, as compared to polysilicon formed in accordance with the low-temperature process. To this end, research into development of polysilicon formation techniques is currently being conducted where amorphous silicon, capable of being deposited at a low temperature, is crystallized into polysilicon.

Laser annealing uses a method for irradiating a pulse-shaped laser beam to a substrate. In accordance with this method, melting and solidifying amorphous silicon are repeated at intervals of 10 to $10^2$ nanoseconds by the pulse-shaped laser beam. This technique minimizes damage to a lower insulating substrate. Because of such an advantage, laser annealing has been the most preferred technique for the low-temperature crystallization process.

Hereinafter, a silicon crystallization method using the above-mentioned laser annealing will be described in conjunction with the annexed drawings. FIG. 1 is a graph depicting the grain size of amorphous silicon depending on the density of laser energy. As shown in FIG. 1, crystallization of amorphous silicon may be classified into three regions in accordance with the intensity of laser energy.

The first region is a partial melting region, in which laser energy is irradiated on an amorphous silicon layer at an intensity capable of melting only the surface of the amorphous silicon layer. In the first region, the surface of the amorphous silicon layer is partially melted in accordance with the irradiation. After solidification, small-sized crystal grains are formed at the surface of the amorphous silicon layer.

The second region is a near-complete melting region, in which laser energy is irradiated to an amorphous silicon layer at an intensity higher than that of the first region capable of almost completely melting the amorphous silicon layer. Small nuclei remaining after the melting are used as seeds to grow the crystals. Although it is possible to grow more crystal grains in the second region as compared to the first region, it is difficult to obtain homogenous crystal grains. Furthermore, the second region is considerably narrow, as compared to the first region.

The third region is a complete melting region, in which laser energy is irradiated to an amorphous silicon layer at an intensity higher than that of the second region capable of completely melting the amorphous silicon layer. In this case, solidification occurs after the amorphous silicon has been completely melted. Accordingly, homogeneous nucleation of crystals is possible. After the irradiation, a crystalline silicon layer consisting of homogenous fine crystal grains is formed.

In the process of producing polysilicon using the laser density of the second region, the number of times the laser beam is irradiated and the laser beam overlap ratio are controlled to enable formation of homogenous large crystal grains. However, the boundaries of crystal grains of polysilicon obstruct current flow. For this reason, it is difficult to obtain a reliable thin film transistor device. Furthermore, an insulating film over which polysilicon is grown becomes damaged due to current induced by collision of electrons in the crystal grains of the polysilicon. The result is a product having poor quality.

In order to solve this problem, sequential lateral solidification (SLS) technique was proposed for forming single-crystalline silicon. This technique is based on the fact that silicon crystal grains are grown at the boundary between liquid-phase silicon and solid-phase silicon in a direction perpendicular to the boundary (Robert S. Sposilli, M. A. Crowder, James S. Im, Mat. Res. Soc. Symp. Proc. Vol. 452, 956~957, 1997). In accordance with the SLS technique, it is possible to crystallize amorphous silicon into single crystals of 1 μm or greater by appropriately adjusting the laser energy intensity, irradiation range, and translation distance of a laser beam irradiated on the amorphous silicon such that silicon crystal grains are laterally grown to a certain length. One draw back is that an irradiation device typically used in such an SLS process cannot change amorphous silicon deposited over a large-area substrate into polycrystalline silicon at one time because the typical irradiation device concentrates a laser beam on a narrow region of the substrate. To this end, a substrate deposited with an amorphous silicon layer is mounted on a movable stage. After a laser beam irradiates a certain region of the substrate, the substrate is repositioned by moving the stage to allow the laser beam to irradiate the next region of the substrate. In such a manner, the entire region of the substrate is irradiated by the laser beam.

FIG. 2 is a schematic view illustrating a general SLS irradiation device. As shown in FIG. 2, the SLS irradiation device includes a laser generator for generating a laser beam, an attenuator 1 for controlling the energy intensity of the laser beam, a first mirror 2a for changing the traveling path of the laser beam, a telescopic lens 3 for diverging the laser beam, and a second mirror 2b for again changing the traveling path of the laser beam. The SLS irradiation device also includes a lens 4 for homogenously condensing the laser beam, a third mirror 2c for again changing the traveling path of the laser beam, and a field lens 5 for changing the shape of the laser beam to an appropriate shape enabling the laser beam to be incident to a laser beam pattern mask 6. The laser beam pattern mask 6 has a predetermined pattern allowing selective transmission of the laser beam. The SLS irradiation device further includes a projection lens 7 for reducing the scale of the laser beam passing through the laser beam pattern mask 6 to a predetermined scale and irradiating the same onto substrates.

The laser generator is an excimer laser typically employing XeCl (308 nm) or KrF (248 nm). The laser generator emits an unprocessed laser beam, which is converted into a predetermined laser beam pattern by sequentially passing through the attenuator 1, the mirrors 2a, 2b, and 2c adapted to change the traveling path of the laser beam, the lenses 5 and 7 having particular functions, and the laser beam pattern mask 6. The processed laser beam having the predetermined pattern is then irradiated on substrate 10.

Mirrors 2a, 2b and 2c are used to minimize the space occupied by the SLS irradiation device. In some cases, the space occupied by the SLS irradiation device may be increased or reduced by adjusting the number of mirrors.

A movable stage 8, on which a substrate 10 deposited with an amorphous silicon layer is mounted, is arranged at a position corresponding to the laser beam pattern mask 6. The stage 8 may be an X-Y stage. Since the substrate 10 is mounted on the stage 8 after fabrication, means for fixing the substrate 10 on the stage 8 is provided to prevent the substrate 10 from moving in relation to the stage 8 during the crystallization process. Crystallization of the entire region of the substrate 10 is achieved by moving the stage 8 in the X and Y directions such that the crystallized region of the substrate 10 is gradually increased.

The laser beam pattern mask 6 is divided into transmission portions, through which the laser beam passes, and shield portions, which block transmission of the laser beam. The width of each transmission portion determines the lateral growth length of crystal grains formed in one exposure.

Hereinafter, the laser beam pattern mask 6 will be described in detail with reference to the annexed drawings. FIG. 3 is a plan view illustrating a laser beam pattern mask used in a conventional laser irradiation process. FIG. 4 is a crystallized region formed in one shot of laser beam irradiated using the laser beam pattern mask of FIG. 3.

As shown in FIG. 3, the laser beam pattern mask, which is used in the conventional laser irradiation process, includes transmission portions A each providing an opened pattern having a first width a, and shield portions B each providing a shielded pattern having a second width b. The transmission portions A and shield portions B are alternately arranged.

Laser irradiation using the laser beam pattern mask is carried out as follows. A single shot of laser beam is irradiated on a substrate deposited with an amorphous silicon layer through the laser beam pattern mask 6 positioned above the substrate. At this time, the laser beam is irradiated on areas 22 (FIG. 4) corresponding to respective transmission portions A of the laser beam pattern mask 6. As a result, the portions of the amorphous silicon layer corresponding to respective irradiated areas 22 are melted into a liquid phase, as shown in FIG. 4. In this case, the intensity of laser energy used is in the range of the complete melting region capable of completely melting the amorphous silicon layer in the irradiated areas 22.

The region in which the substrate is irradiated by the laser beam in one shot is referred to as a "unit region" 20. The unit region 20 is defined to have a horizontal length L and a vertical length S as shown in FIG. 3.

Following the laser beam irradiation, silicon grains 24a and 24b are grown in each irradiated areas 22. The silicon grains 24a and 24b grow laterally toward boundary surfaces 21a and 21b. The boundary surfaces 21a and 21b are formed between the solid-phase amorphous silicon area and the liquid-phase area where the amorphous silicon layer has completely melted into a liquid phase. The lateral growth of the silicon grains 24a and 24b is in a direction perpendicular to the boundary surfaces 21a and 21b.

When the width of the irradiated areas 22 corresponding to each transmission portion A is less than two times the growth length of the silicon grains 24a and 24b, the silicon grains 24a and 24b, which are grown inside of an area defined between the boundary surfaces 21a and 21b in a direction perpendicular to the boundary surfaces 21a and 21b, come into contact with each other during the growth. This contact stops the growth of silicon grains 24a and 24b.

In order to grow more silicon grains, the stage on which the substrate is mounted is subsequently moved to allow unexposed areas of the substrate adjacent to the irradiated areas 22 to be irradiated. Subsequent irradiations allow crystal grains to grow connected to the crystal grains formed in the previous irradiation. Generally, the growth length of crystal grains connected to the previously irradiated areas is determined by the width of each transmission portion A and the width of each shield portion B in the laser beam pattern mask 6.

FIG. 5 is a plan view illustrating sequential processing steps of the conventional crystallization process. The conventional silicon crystallization process proceeds on the substrate 10 in the order shown in FIG. 5. That is, the irradiation position on the substrate 10 is horizontally translated from right to left (along the X-axis in the negative direction) by a distance corresponding to the length L of each transmission portion A of the laser beam pattern mask 6 as shown in FIG. 3 (translation ①). Translation ① is repeated after each crystallization process until the crystallization process is completed for a region corresponding to the horizontal length of the substrate 10.

Thereafter, the irradiation position on the substrate 10 is vertically translated from the upper side to the lower side (along the Y-axis in the negative direction) by a distance corresponding to ½ of the total width of one transmission portion A and one shield portion B in the laser beam pattern mask 6 ((a+b)/2) (translation ②) and the crystallization process is carried out. Subsequently, the irradiation position on the substrate 10 is again horizontally translated from to right (along the X-axis in the positive direction) by a distance corresponding to the length L of each transmission portion A of the laser beam pattern mask 6 (translation ③) and the crystallization process is carried out. The translation ③ is repeated after every crystallization process until the crystallization process is completed for a region corresponding to the horizontal length of the substrate 10. The crystallization process associated with the translation ② and translation ③ is carried out for unirradiated areas in each unit region 20 of the substrate 10 irradiated in the crystallization process associated with translation ①. As described above, the unit region 20 corresponds to the size of the laser beam pattern mask 6. The irradiated areas in the crystallization process associated with translation ② and translation ③ are partially overlapped with the irradiated areas in the crystallization process associated with translation ① so as to connect the growth of crystals connected to the crystals formed in the previous crystallization process associated with translation ①.

Thereafter, the irradiation position on the substrate 10 is vertically translated from the upper side to the lower side (in a negative Y-axis direction) by a distance corresponding to the vertical length S of the laser beam pattern mask 6 (translation ④). After translation ④, the procedures associated with translations ① to ④ are repeated to complete crystallization for the entire surface of the substrate 10.

The translation of the irradiation positions on the substrate 10 is achieved by moving the stage 8 (in FIG. 2), on which the substrate 10 is mounted, in relation to the laser beam pattern mask 6, which is fixed. The movement of the stage 8 is carried out in a direction opposite to the directions shown for translations ① to ④ in FIG. 5.

FIGS. 6A and 6B are scanning electron microscope (SEM) micrographs showing polysilicon grown in accordance with the conventional crystallization method. When a polysilicon layer is formed in accordance with the crystallization method of FIG. 5 using the conventional laser beam pattern mask, an overlap region is formed between adjacent crystallized areas or patterns. This overlap region can be macroscopically observed in the form of a line, in contrast to other crystallized areas. The overlap region can be macroscopically observed in the form of a line because laser beam irradiation is carried out two or more times for the same region in the typical crystallization method of FIG. 5. That is, such a linear overlap region is created when laser beam irradiation on the substrate is carried out using a laser beam pattern mask in which a plurality of linear transmission portions having a certain width are uniformly spaced apart from one another by a certain distance.

In this case, the overlap regions of the crystallized patterns are macroscopically observed in the form of a plurality of spaced lines. These overlap regions serve as grain boundaries. When an active element is arranged on such an overlap region, the performance characteristics of the element are reduced because the mobility of elections at the grain boundaries are affected.

FIG. 6B is a SEM micrograph in the case in which the length of crystallized grains is smaller than that of FIG. 6A. In either case of FIG. 6A or FIG. 6B, a plurality of lines serving as grain boundaries were observed in the overlap regions of the crystallized patterns. Thus, the above-mentioned conventional laser beam pattern mask and the conventional crystallization method using the conventional laser beam pattern mask have various problems.

First, when laser beam patterns are irradiated on a substrate through the conventional laser beam pattern mask in a crystallization process, irradiation overlap is generated between adjacent laser beam patterns. In particular, the irradiation of the laser beam patterns is carried out through the linear transmission portions of the laser beam pattern mask. In this case, linear overlap regions are formed between adjacent irradiated areas. Normal crystallization cannot be achieved in the linear overlap regions, so the linear overlap regions create linear grain boundaries. These linear grain boundaries are generated in a regular and repeated pattern.

If crystallization involving repeated formation of such linear grain boundaries is effectuated at pixel regions on the substrate, different signal lines on the substrate may interfere with each other. Such interferences may be observed in the form of wavy image patterns, such as a moire pattern.

Second, when crystallization involving repeated formation of the above-mentioned linear grain boundaries is effectuated at regions corresponding to drivers on the substrate, the possibility of grain boundaries being formed in the channels of active elements increases. As a result, the reliability of the elements may be greatly affected.

SUMMARY OF THE INVENTION

Accordingly, the present invention is directed to a liquid crystal display device and a method for manufacturing the same that substantially obviate one or more problems due to limitations and disadvantages of the related art.

An object of the present invention is to provide a laser beam pattern mask, which includes transmission portions each having a hexagonal dot pattern, thereby improving the crystallization characteristics and a crystallization method using the laser beam pattern mask.

Additional advantages, objects, and features of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a laser beam pattern mask includes a substrate which blocks light, and a plurality of transmission portions formed through the substrate, and adapted to transmit light, wherein the transmission portions are arranged along a plurality of lines extending in a first direction while being uniformly spaced apart from one another by a predetermined distance in a second direction perpendicular to the first direction, and each of the transmission portions includes hexagonal cells arranged along an associated one of the lines while being in contact with one another.

In another aspect of the present invention, a crystallization method includes the steps of preparing a substrate deposited with an amorphous silicon film, fixedly mounting the substrate on a stage, positioning over the stage a laser beam pattern mask which comprises a plurality of transmission portions arranged in parallel along a plurality of lines, each of the transmission portions including hexagonal cells arranged in contact with one another, and irradiating a laser beam to the amorphous silicon film through the laser beam pattern mask after moving the laser beam pattern mask or the stage, thereby crystallizing the amorphous silicon film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Figure 1:
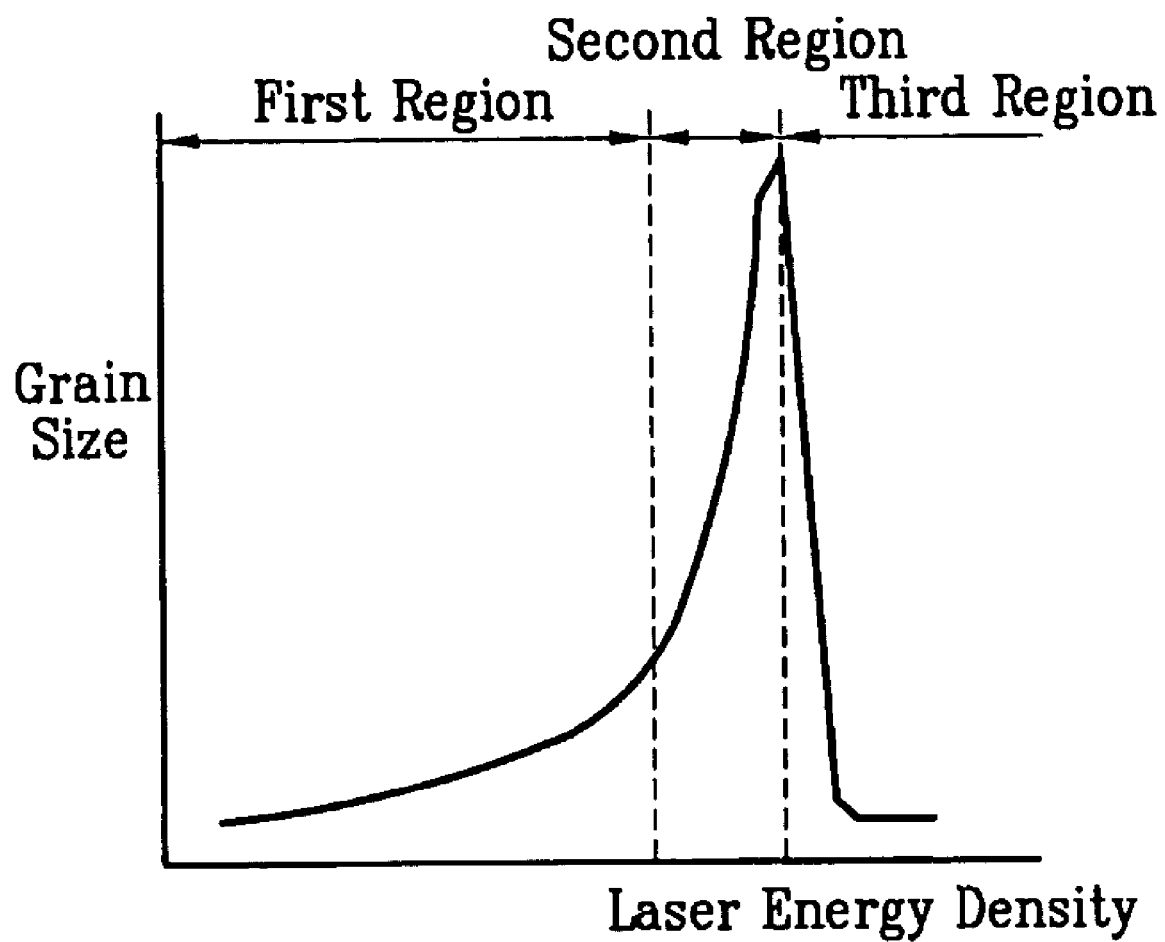
FIG. 1 is a graph depicting the grain size of amorphous silicon depending on the density of laser energy according to the related art.
Figure 2:
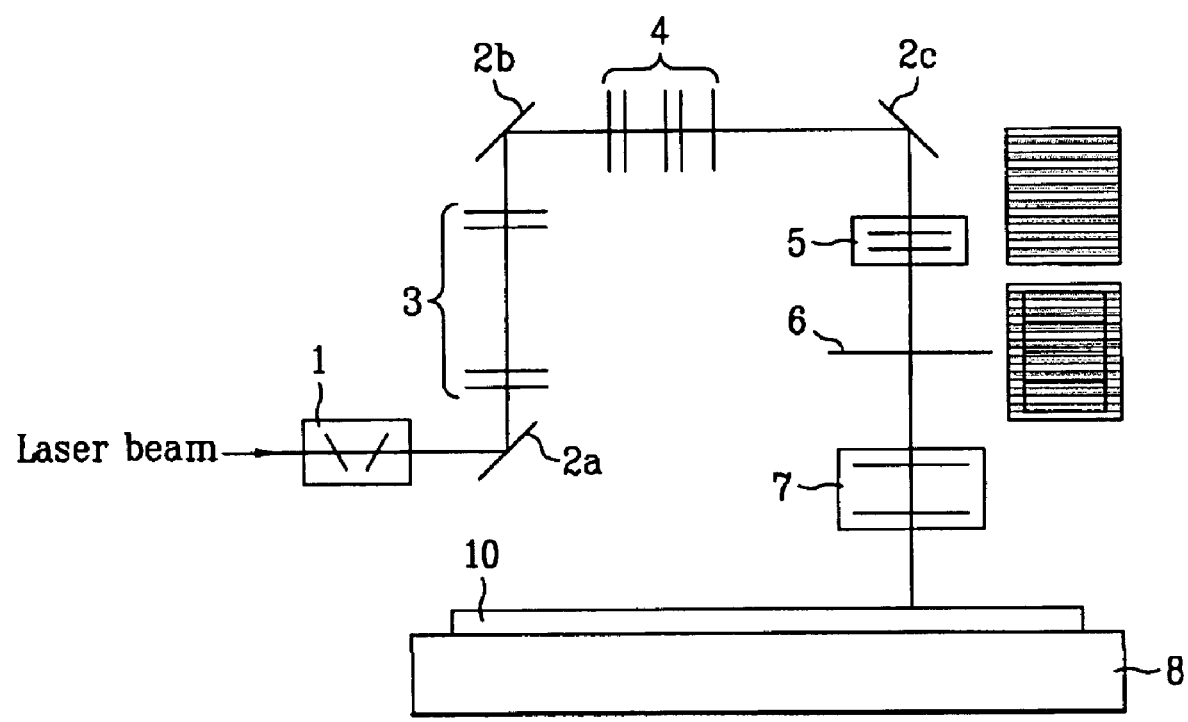
FIG. 2 is a schematic view of a SLS irradiation device according to the related art.
Figure 3:
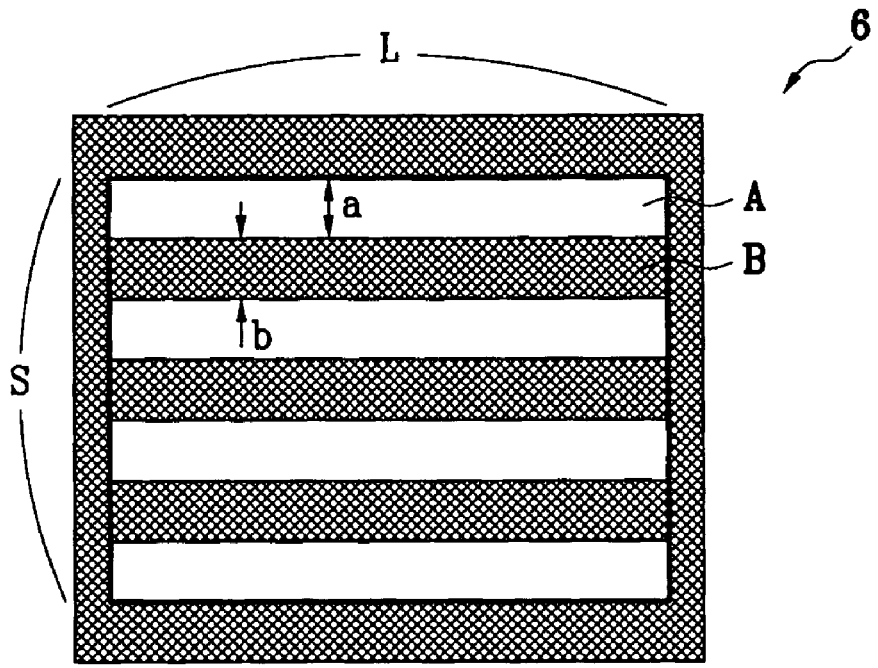
FIG. 3 is a plan view of a laser beam pattern mask used in a laser irradiation process according to the related art.
Figure 4:
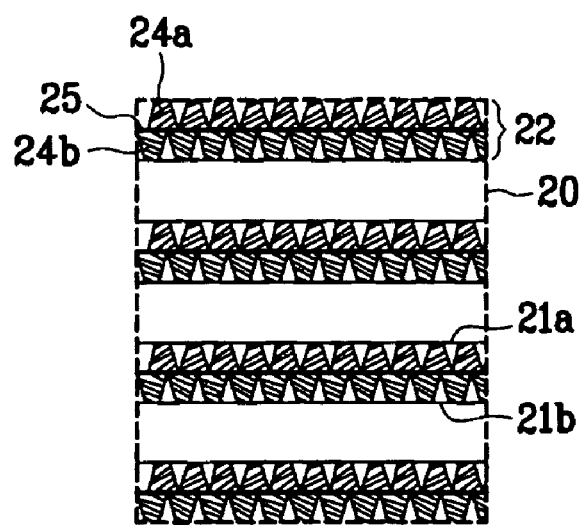
FIG. 4 is a crystallized region formed in one shot of laser beam irradiation carried out using the laser beam pattern mask of FIG. 3 according to the related art.
Figure 5:
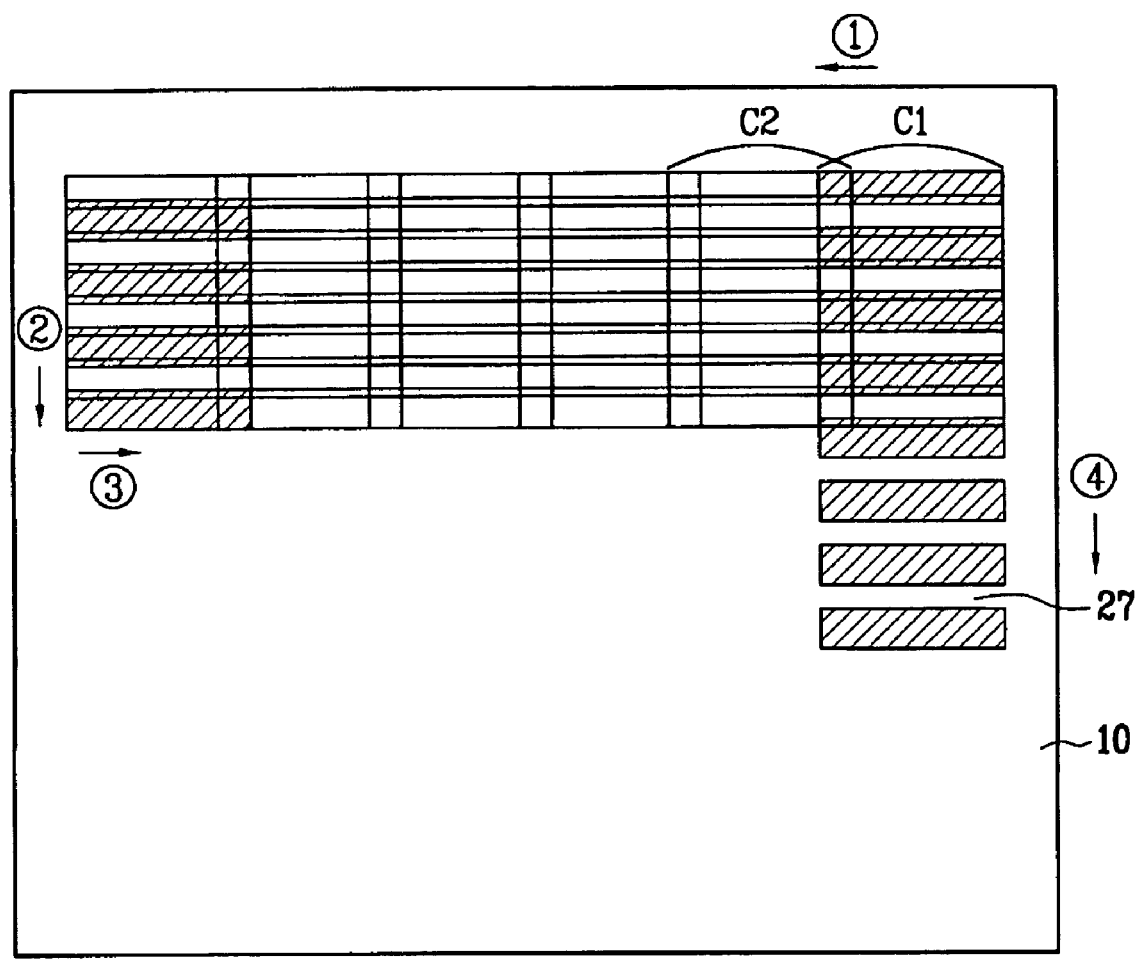
FIG. 5 is a plan view illustrating sequential processing steps of a crystallization process according to the related art.
Figure 6A:
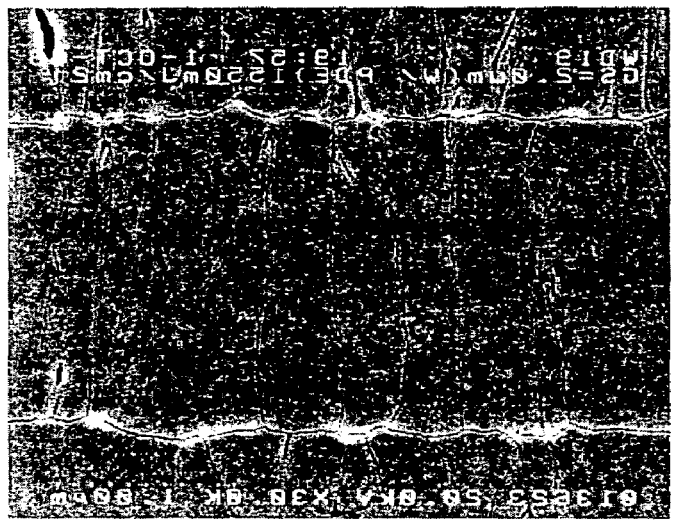
FIGS. 6A and 6B are scanning electron microscope (SEM) micrographs showing polysilicon grown according to the related art.
Figure 6B:
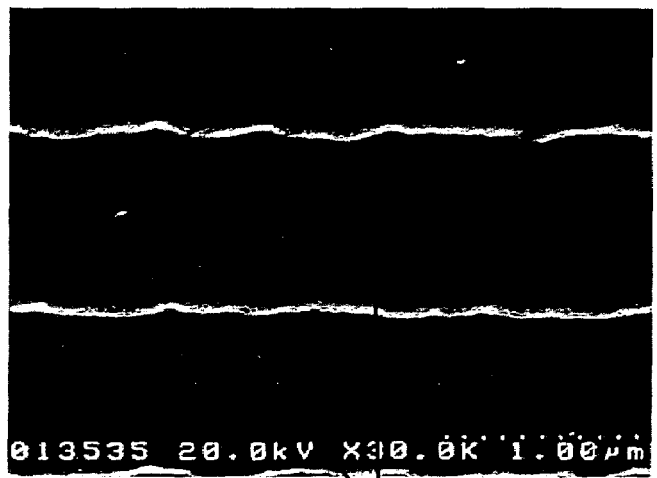
Figure 7:
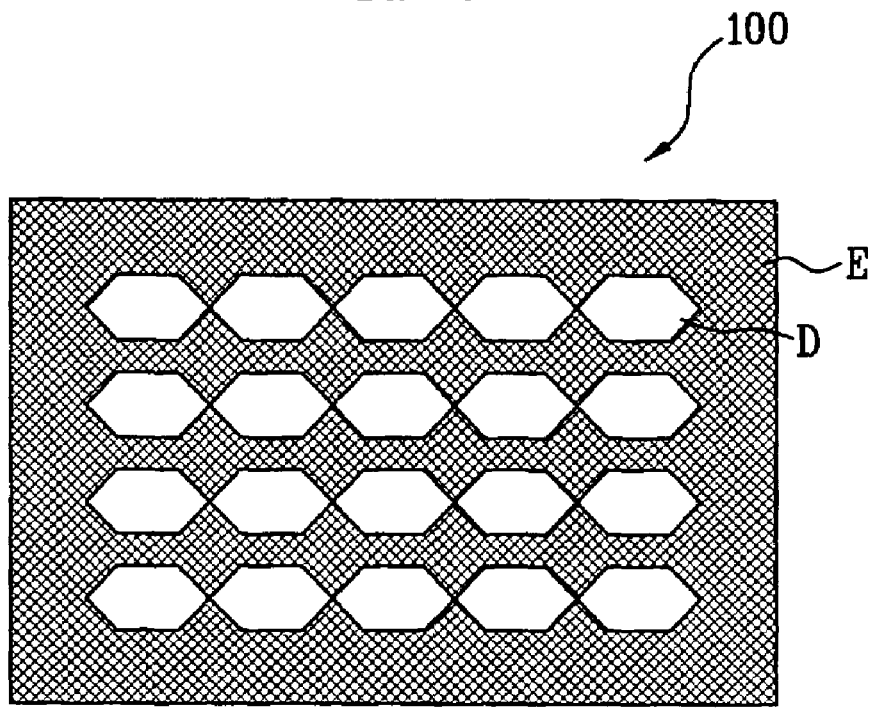
FIG. 7 is a plan view illustrating an exemplary laser beam pattern mask according to an embodiment of the present invention.

Reference will now be made in detail to the preferred embodiments of the present invention, examples of which are illustrated in the accompanying drawings. FIG. 7 is a plan view illustrating an exemplary laser beam pattern mask according to an embodiment of the present invention and FIG. 8 is an enlarged view illustrating exemplary adjacent cells shown in FIG. 7.

As shown in FIG. 7, the laser beam pattern mask 100 includes a plurality of transparent transmission portions D extending along a plurality of horizontal lines, respectively. Each transmission portion D includes an odd number of hexagonal cells that are in contact with one another.

The transmission portions D are horizontally arranged in parallel while being vertically spaced apart from one another. The hexagonal cells of each transmission portion D are aligned along the horizontal line of the transmission portion D. The remaining portion of the laser beam pattern mask 100 is a shield portion E.

Figure 8:
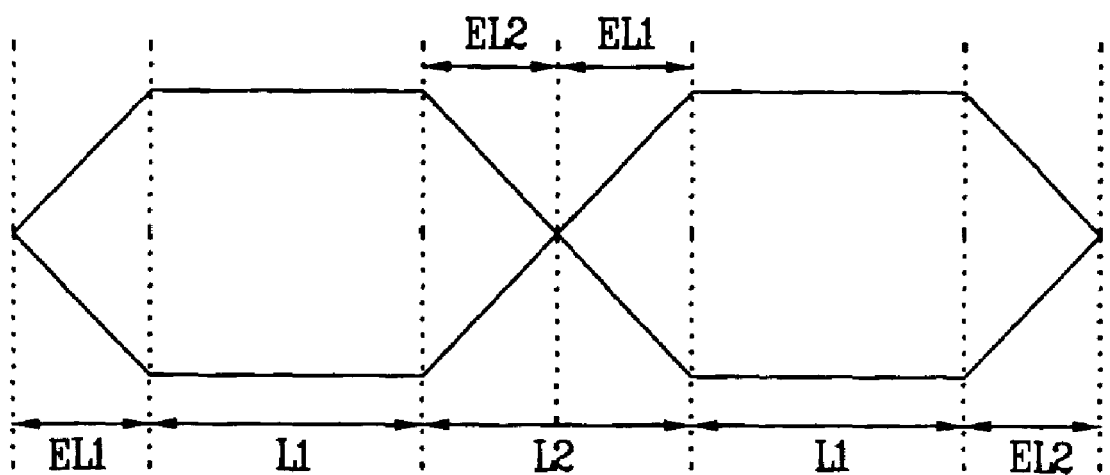
FIG. 8 is an enlarged view illustrating exemplary adjacent cells shown in FIG. 7 according to an embodiment of the present invention.

As shown in FIG. 8, each hexagonal cell includes a rectangular central portion having a horizontal length L1 and isosceles-triangular edge portions protruding horizontally from opposite sides of the central portion, respectively. The left edge portion has a horizontal length EL1, and the right edge portion has a horizontal length EL2. Accordingly, the total horizontal length of the edge portions, the apexes of which are in contact with each other, in adjacent hexagonal cells, correspond to "L2" (L2=EL1+EL2).

The horizontal length L1 of the central portion is equal to or longer than the total horizontal length L2 of the edge portions arranged at the opposite sides of the central portion. The central portion of each hexagonal cell on each horizontal line is arranged at the same vertical position as the central portions of associated ones of the hexagonal cells, which are arranged on the remaining horizontal lines.

Figure 9:
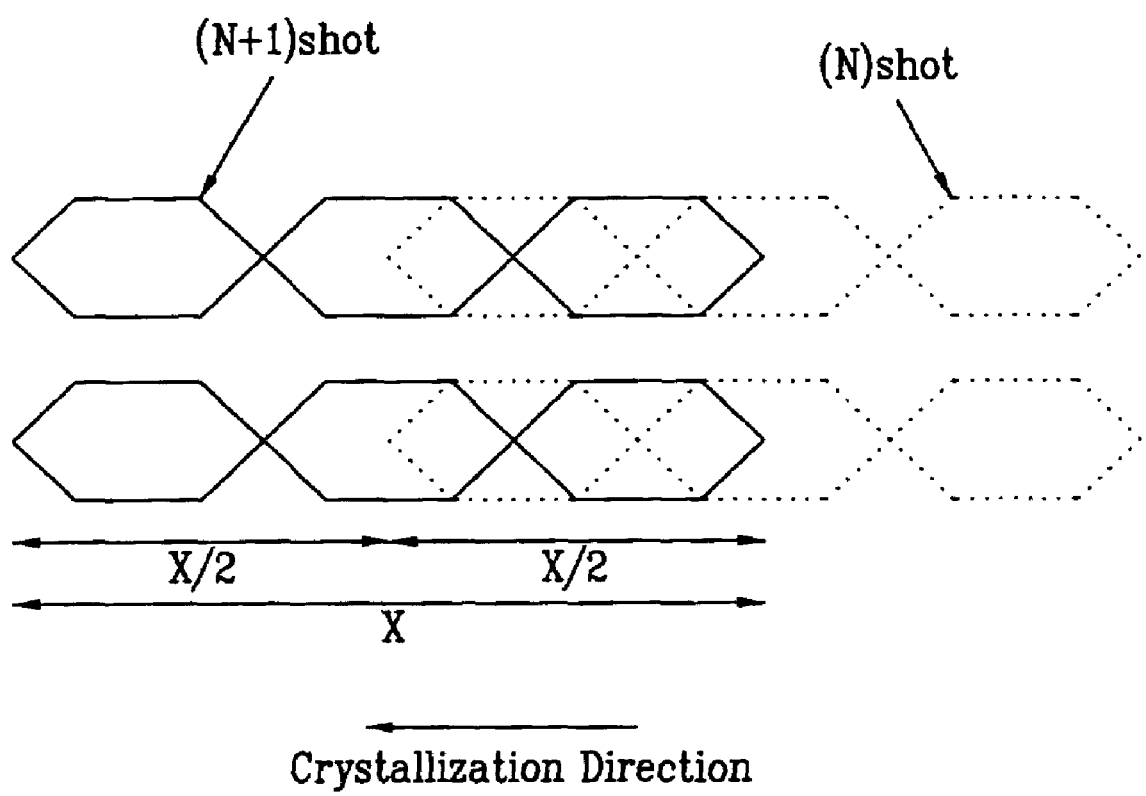
FIG. 9 is a schematic view illustrating exemplary crystallized regions formed after two successive shots of laser beam irradiation carried out using the mask of FIG. 7 according to an embodiment of the present invention.

FIG. 9 illustrates exemplary crystallized regions formed after two successive shots of laser beam irradiation carried out using the mask of FIG. 7 according to the present invention. When successive laser irradiation processes are performed by moving the laser beam pattern mask or a stage on which the substrate is disposed in a horizontal direction, the movement distance, that is, the translation distance of the irradiated position on the substrate corresponds to ½ of the length X (X/2) of one transmission portion D for a predetermined number of continuous hexagonal cells (e.g., three continuous hexagonal cells), as shown in FIG. 9. An odd number of continuous hexagonal cells are preferred, but any number of continuous hexagonal cells may be used. When the successive horizontal laser irradiation is performed, uniform crystallization is achieved over the entire region of the substrate, except for the initially-irradiated region corresponding to ½ of the length X (X/2) of one transmission portion D.

Hereinafter, the crystallization method using the above-described exemplary laser beam pattern mask in accordance with an embodiment of the present invention will be described with reference to the annexed drawings. FIGS. 10A to 10D are plan views illustrating exemplary processing steps of the crystallization method according to the embodiment of the present invention.

First, a substrate (not shown) is prepared on which an amorphous silicon thin film is deposited. Then, the substrate is fixedly mounted on a stage (not shown). Next, laser beam pattern mask having a structure, as shown in FIG. 7, is then prepared. For purposes of explanation only, each transmission portion of the laser beam pattern mask in the following example includes three cells. However, any number of hexagonal cells may be used.

Figure 10A:
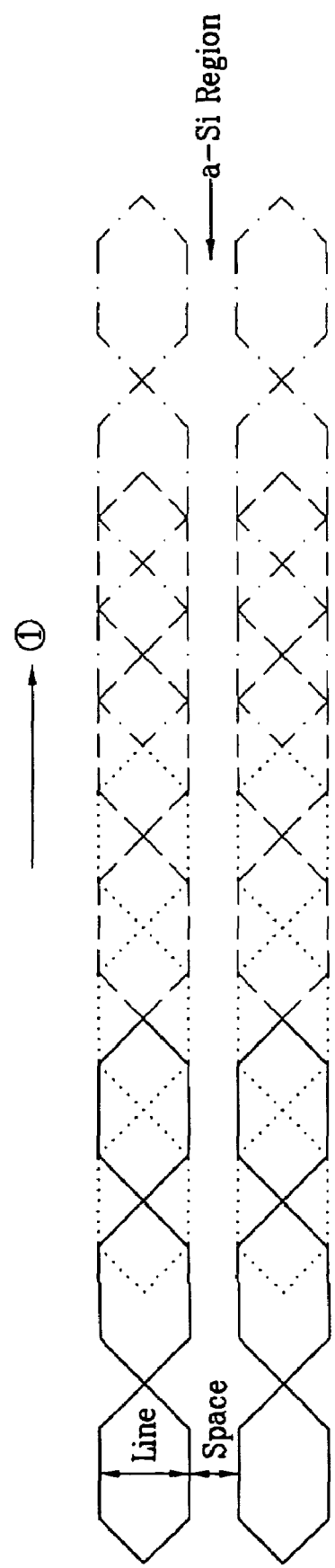
FIGS. 10A to 10D are plan views illustrating exemplary processing steps of a crystallization method according to an embodiment of the present invention.

Thereafter, successive horizontal crystallization is performed in a direction from the left to the right (translation ①), as shown in FIG. 10A. In this case, the horizontal translation distance of the irradiated position on the substrate per one shot corresponds to ½ of the length X (X/2) of one transmission portion in the laser beam pattern mask, as shown in FIG. 9. The translation of the irradiation position is achieved by moving the stage on which the substrate is mounted with respect to the laser beam pattern mask. Alternatively, the laser beam pattern mask may be moved with respect to the substrate.

After completion of the successive horizontal crystallizations, the region of the substrate not corresponding to the transmission portions D of the laser beam pattern mask remains in an amorphous silicon (a-Si) state. That is, crystallization is achieved only in the irradiated region of the substrate corresponding to each transmission portion D. The irradiated region of the substrate corresponding to each transmission portion D is referred to as a "line," and the region of the substrate not corresponding to the transmission portions D is referred to as a "space." In every shot, crystallization is achieved for a unit region of the substrate corresponding to a unit block of the laser beam pattern mask.

Figure 10B:
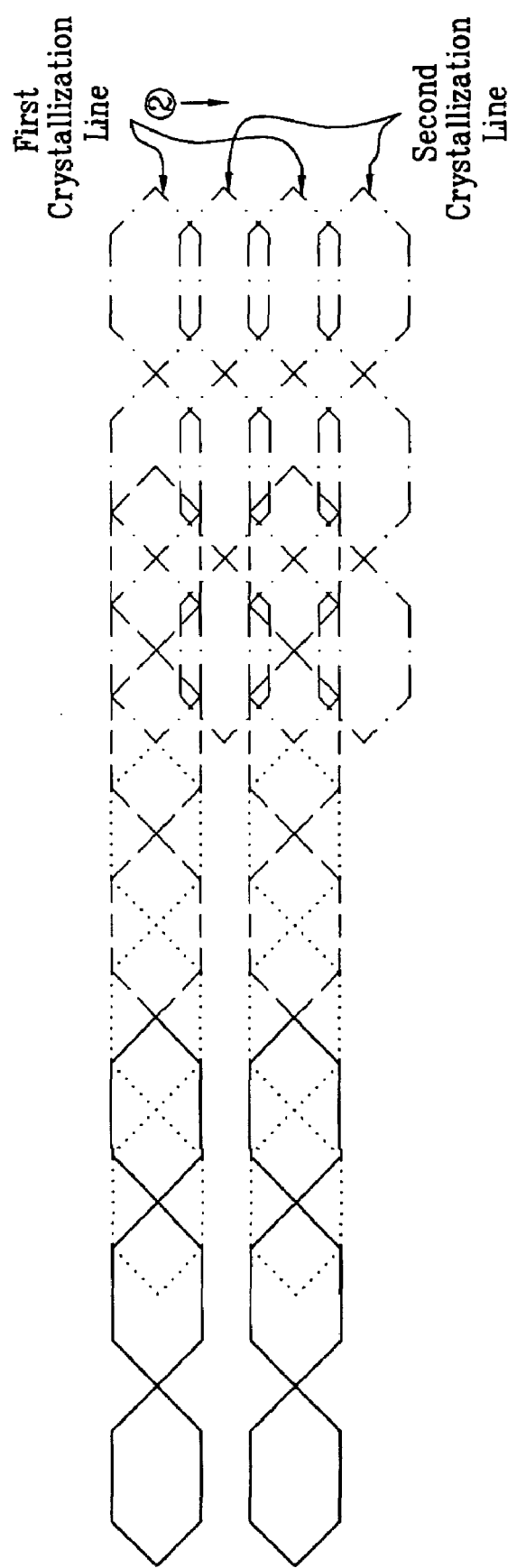

Thereafter, the irradiation position on the substrate is vertically translated per one shot by a distance corresponding to 1/n (where n is 2 or greater) of the total width of one line and one space by vertically moving the laser beam pattern mask or the stage on which the substrate is mounted (translation ②), as shown in FIG. 10B. For the purposes of illustration, it is assumed that n is 2. Accordingly, that the unit region of the substrate corresponding to the unit block of the laser beam pattern mask is completely crystallized by two shots of laser beam irradiation. If n is greater than 2, then the laser beam irradiation needs to be performed more than 2 shots to completely crystallize the unit region of the substrate. This also means that the length of crystal grains grown after the crystallization may vary.

Figure 10C:
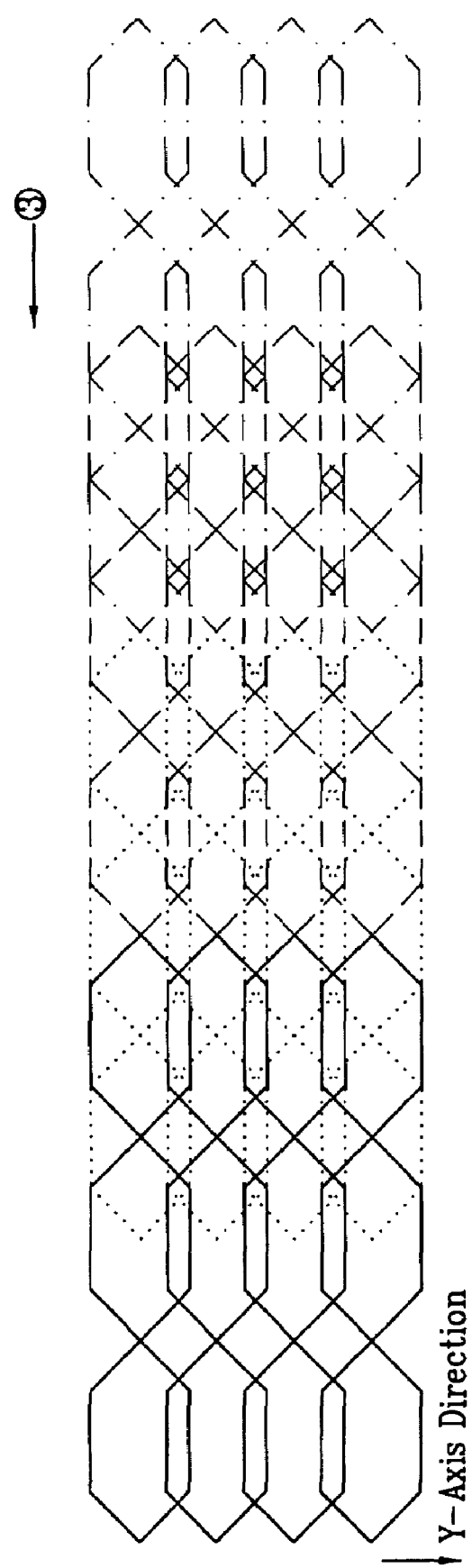

Thereafter, successive horizontal crystallization is performed in a direction from the right to the left (translation ③), as shown in FIG. 10C. In this case, the translation distance of the irradiation position on the substrate per one shot corresponds to ½ of the length X (X/2) of one transmission portion in the laser beam pattern mask. The translation of the irradiation position is achieved by moving the substrate or the laser beam pattern mask. In every shot, the successive horizontal crystallization is achieved for the unit region of the substrate corresponding to the unit block of the laser beam pattern mask.

Figure 10D:
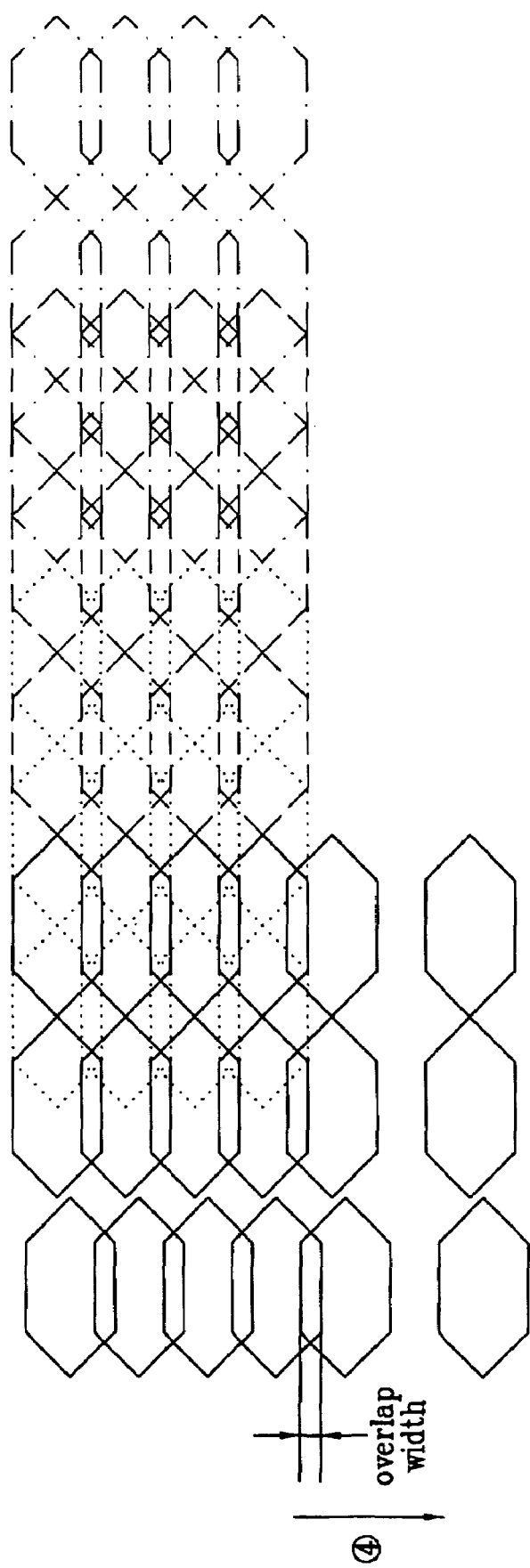

Subsequently, the irradiation position on the substrate is vertically translated per one shot by a distance corresponding to 1/n (n is 2 in this example) of the total width of one line and one space by vertically moving the laser beam pattern mask or the stage on which the substrate is mounted (translation ④), as shown in FIG. 10D. In the crystallization associated with translation ④, the unit region of the substrate corresponding to the unit block of the laser beam pattern mask is completely crystallized by 2 shots of laser beam irradiation.

Thereafter, the crystallization for the entire region of the substrate is completed by repeating the procedures of FIGS. 10A to 10D. Thus, the amorphous silicon thin film deposited over the substrate is completely crystallized into a polysilicon layer.

When crystallization is carried out using the laser beam pattern mask according to the exemplary embodiment of the present invention, laser beam patterns irradiated on the substrate have overlap regions between adjacent ones of the laser beam patterns. However, the overlap regions do not have the form of a continuous long line, but are formed in the form of discontinuous short lines or dots between the edges of the central portions of the vertically adjacent hexagonal cells, as shown in FIG. 10D.

Figure 11:
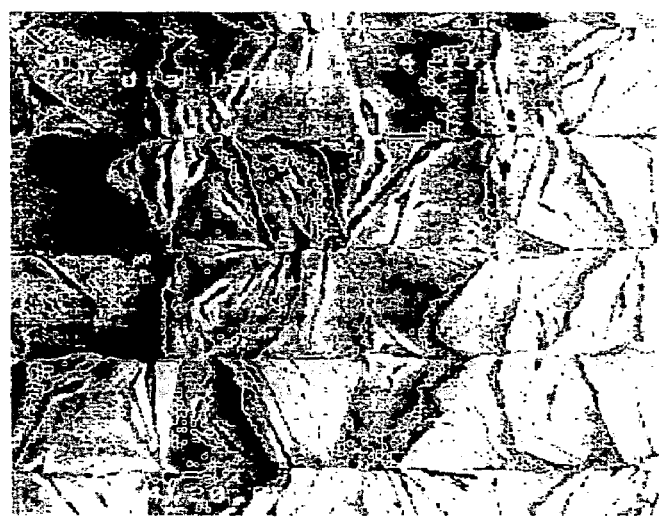
FIG. 11 is a SEM micrograph showing exemplary polysilicon grown in accordance with the crystallization method according to an embodiment of the present invention.
Figure 12:
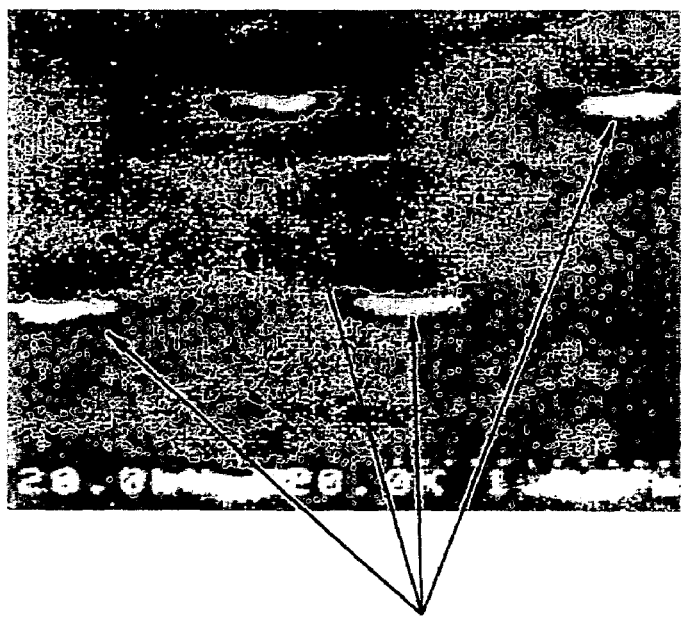
FIG. 12 is an enlarged view of FIG. 11 according to an embodiment of the present invention.

FIG. 11 is a SEM micrograph showing exemplary polysilicon grown in accordance with the crystallization method according to the present invention, and FIG. 12 is an enlarged view of FIG. 11. When crystallization is carried out using the laser beam pattern mask including the transmission portions in accordance with the present invention, polysilicon is formed having regularly arranged crystal grains, as shown in FIG. 11. Also, formation of linear overlap regions between adjacent crystallized patterns is reduced, as shown in FIG. 12. In contrast to the macroscopic continuous lines created using the conventional process, only dot-shaped grain boundaries are formed using the crystallization method according to the present invention.

The exemplary laser beam pattern mask according to the embodiment of the present invention and the crystallization method using same as described above provide several advantageous effects.

First, when crystallization is performed using the laser beam pattern mask including the transmission portions with hexagonal cells arranged in the manner described above, formation of overlap regions between adjacent irradiated areas of the substrate is reduced as compared to the crystallization method using the conventional laser beam pattern mask. Accordingly, the overlap regions that do form have insufficient length to serve as a grain boundary, which normally reduce reliability of elements formed on the substrate. Rather, the resulting grain boundaries appear as uniform dot-patterns, thereby reducing the roughness of grain boundaries formed in the crystallization process and improving the reliability of the elements formed thereon.

Second, the improved structure of laser beam patterns generated according to the present invention eliminates the moire pattern phenomenon that may result using the conventional process. Accordingly, picture quality is also improved.

Third, the improved structure of laser beam patterns generated according to the present invention allows control of linear grain boundary formations in regions corresponding to drivers on the substrate. The formation of grain boundaries having dot-patterns improve reliability of driver elements formed on the substrate. That is, the threshold voltage characteristics and durability of the elements are improved, thereby extending the life of the elements.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A crystallization method, comprising the steps of:
providing a substrate with a deposited amorphous silicon film;
fixedly mounting the substrate on a stage;
positioning a laser beam pattern mask over the stage, the laser beam pattern mask including a plurality of transmission portions extending in a first direction and arranged in parallel with one another, each of the transmission portions having hexagonal cells arranged in contact with one another; and
crystallizing the amorphous silicon film by irradiating a laser beam on the amorphous silicon film through the laser beam pattern mask.

2. The crystallization method according to claim 1, wherein each hexagonal cell in each of the transmission portions comprises:
a rectangular central portion; and
isosceles-triangular edge portions protruding from opposite sides of the central portion, respectively.

3. The crystallization method according to claim 2, wherein each central portion has a length in the first direction equal to or longer than a sum of the lengths of corresponding edge portions in the first direction.

4. The crystallization method according to claim 2, wherein the plurality of transmission portions are arranged in parallel with one another, and the central portions of the hexagonal cells in each of the transmission portions are aligned with associated ones in the second direction perpendicular to the first direction.

5. The crystallization method according to claim 2, wherein the edge portions of adjacent ones of the hexagonal cells in each of the transmission portions contact each other.

6. The crystallization method according to claim 1, wherein each of the transmission portions has an odd number of hexagonal cells.

7. The crystallization method according to claim 1, wherein the step of crystallizing the amorphous silicon film further comprises the steps of:
(A) horizontally moving the laser beam pattern mask or the stage and irradiating the laser beam on the amorphous silicon film through the laser beam pattern mask, thereby creating a plurality of first crystallized regions and amorphous regions;
(B) vertically moving the laser beam pattern mask or the stage;
(C) horizontally moving the laser beam pattern mask or the state in a direction reverse to the moving direction of step (A) and irradiating the laser beam to the amorphous silicon film through the laser beam pattern mask to create a plurality of second crystallized regions in the amorphous regions between the first crystallized regions; and
(D) vertically moving the laser beam pattern mask or the stage, and repeating the steps (A) to (D) until all amorphous regions have been crystallized.

8. The crystallization method according to claim 7, wherein the horizontal movements of the laser beam pattern mask or the stage at step (A) and step (C) are carried out in increments of a distance corresponding to ½ of the length of each transmission portions.

9. The crystallization method according to claim 7, wherein the vertical movements of the laser beam pattern mask or the stage at step (B) and step (D) are carried out for a distance corresponding to 1/N of the width of each transmission portions, wherein N is a natural number equal to or greater than 2.

* * * * *